Oct. 26, 1971

M. S. FREED 3,615,006

STORAGE CONTAINER

Filed June 26, 1969

2 Sheets-Sheet 1

INVENTOR.
MORRIS S. FREED

BY Willis E. Higgins

ATTORNEY

Oct. 26, 1971 M. S. FREED 3,615,006

STORAGE CONTAINER

Filed June 26, 1969 2 Sheets-Sheet 2

United States Patent Office 3,615,006

Patented Oct. 26, 1971

3,615,006
STORAGE CONTAINER

Morris S. Freed, North Plainfield, N.J., assignor to International Business Machines Corporation, Armonk, N.Y.

Filed June 26, 1969, Ser. No. 836,701
Int. Cl. B65d *85/48*
U.S. Cl. 206—62 R 4 Claims

ABSTRACT OF THE DISCLOSURE

A container for a plate, such as a glass mask used in the fabrication of microelectronic integrated circuit devices or other plate which is breakable or has a precision surface liable to damage by contact, having supports for the plate and a member integral to the container for biasing the plate against the supports is provided. The supports and biasing members apply substantially directly opposing forces at the periphery of the plate. The container protects such a glass mask or other plate against breakage or damage and allows rapid insertion or removal of the plate. The container is therefore adapted for storing and handling glass masks used for the high volume production of integrated circuits.

FIELD OF THE INVENTION

This invention relates to a container adapted for storing a breakable plate or a plate having a surface subject to damage by contact. More particularly, it relates to a container for glass masks used in the fabrication of microelectronic integrated circuit devices which is suitable for storing and handling such glass masks under high volume integrated circuit manufacturing conditions.

In the fabrication of integrated circuits, the different circuit elements are obtained by the selective diffusion of donor impurities, such as phosphorus, or acceptor impurities, such as boron, in precisely controlled amounts into minute, precisely defined areas of a semiconductor substrate, such as silicon or germanium. The minute, precisely defined areas into which diffusion occurs are established by etching openings in a protective overcoating, such as silicon dioxide, on the semiconductor substrate. The openings in the protective overcoating are made by photoresist application, exposure, and development, followed by etching. High precision glass masks are used to expose the photoresist in an array of the desired patterns of minute areas. Examples of such patterns in glass masks are disclosed in, for example, Agusta et al., application Ser. No. 539,210, filed Mar. 31, 1966, now U.S. Pat. 3,508,209, entitled "Monolithic Integrated Structure Including Fabrication and Package Therefor," assigned to the same assignee as the present application. The precision required in such glass masks may be appreciated by noting that a desired pattern may be formed from as many as several hundred openings in a region measuring only 0.06" by 0.06". An array of 100 or more of such regions in a semiconductor wafer, which will subsequently be diced into individual chips each containing one such pattern, is exposed simultaneously through the glass mask in the photoresist coating the wafer.

The glass mask containing the array of patterns to be exposed in the photoresist is prepared by photographic techniques with special high resolution emulsions. In order to maintain image integrity of the patterns in the masks, it is necessary that the masks be handled with utmost care. The photoresist is selectively exposed using the glass mask in an ultra clean contamination controlled room to minimize the presence of dust and other contamination on the photoresist or the mask. Before use, each mask is cleaned by blowing it with dust-free air to remove as much of any dust and other contaminants from the mask surface as possible. Since the pattern is made up of a large number of extremely small areas, dust or other contaminants will scratch the mask or otherwise introduce defects in the pattern areas, particularly when the mask contacts the protoresist-coated wafer. These defects are in turn reproduced in the photoresist when the mask is used to expose it. When enough defects have been introduced in a mask to decrease yields of defect-free integrated circuits below acceptable levels, the mask is discarded. With ever decreasing integrated circuit geometry sizes, the problem of maintaining image integrity becomes increasingly severe. A container for the masks which will prevent dust or other contaminants from entering and being deposited on the masks is therefore needed. Also, since each precision mask is quite expensive to fabricate, it is desirable to protect the masks to the fullest extent possible against damage by breakage from jostling or dropping. Some form of shock absorbent container is therefore required for the masks. Under high volume integrated circuit production conditions, it is necessary to insert and remove glass masks from such storage and handling containers very rapidly.

DESCRIPTION OF THE PRIOR ART

An example of a known container for glass masks used in semiconductor fabrication consists of a hinged plastic container with a bed of foam rubber or plastic on which the mask rests within the container. Such a container is shock absorbent enough to prevent breakage of the mask under ordinary conditions, and it allows rapid insertion and removal of the masks. A serious disadvantage of this container, particularly in more advanced integrated circuit applications, is that the foam rubber or plastic forms dust or small particles within the container, which are transferred to the mask surface. This makes the cleaning operation carried out on the mask before it is used to expose photoresist on semiconductor wafers more difficult, results in damage to the glass mask, and reduces the number of times a mask may be used to expose photoresist before it must be discarded.

Of the prior art containers for breakable sheet material, there are none which have been shown to be suitable in meeting the requirements for a glass mask container. U.S. Pats. 3,389,785 and 3,389,786 disclose containers for protecting sheets of glass against breakage during shipping. Containers having the arrangements there disclosed would not be suitable for storing glass masks used for the high volume production of integrated circuits. U.S. Pat. 3,107,783 discloses a container for phonograph records, also not suitable for storing glass masks used in high volume integrated circuit production.

While the art for packaging breakable sheets is a highly developed one, there still remains a need for a container which will meet the specific requirements of glass mask packaging and be suitable for production line handling of the masks.

SUMMARY OF THE INVENTION

Accordingly, it is an object of the invention to provide a container for a plate which is breakable or which has a surface liable to damage by contact having means for holding the plate within the container capable of preventing breakage or damage to the plate yet allowing rapid insertion and removal of the plate.

It is another object of the invention to provide a container for a breakable plate capable of preventing damage or breakage of the plate in the container and for preventing dust and other contaminants from contacting the plate.

It is a further object of the invention to provide a container for storing glass masks suitable for high production use of the glass masks in integrated circuit manufacturing.

These and other related objects are attained in the container for a plate herein disclosed. In accordance with the invention, a container having a top and bottom has means in the bottom of the container for supporting a plate. Means integral to the top of the container for biasing the plate against the means for supporting the plate is provided. The means for supporting and means for biasing the plate co-act to apply substantially directly opposing forces at the periphery of the plate when the container is closed. For breakable plates such as glass masks, which are liable to damage from dust, dirt, and other contaminants on the mask surface, a gasket in sealing relationship between the edges of the top and bottom of the container when the container is closed is preferably provided to prevent the introduction of such contaminants when the container is closed.

A container having support and biasing means which apply substantially directly opposing forces at the periphery of a breakable plate enables such a plate to be securely held within the container, yet not apply substantial bending stresses to the plate in so holding it. This prevents breakage of the plate should the container be dropped. Since the support means and the biasing means contact the plate at its periphery, damage to a precision surface liable to damage from contact, such as an array of patterns on one surface of a mask, is prevented. When the container is opened, the biasing means is removed from contact with the plate and swings away with the top, thus allowing very easy removal and insertion of the plate. These features and advantages of the invention, while making the container of particular advantage for holding glass masks used to produce integrated circuit devices, make the container highly suited for storing and handling a wide variety of other plates.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
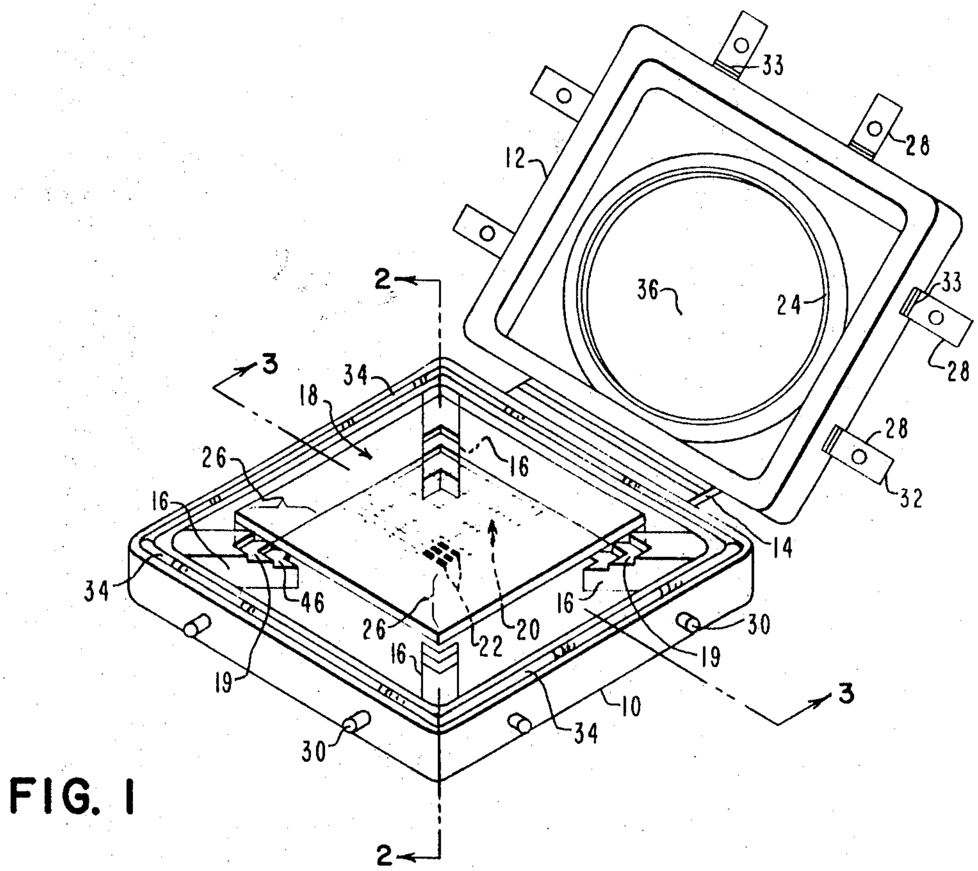
FIG. 1 is a perspective view of an embodiment of the claimed container.
Figure 2:
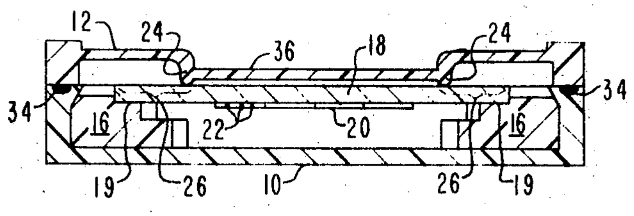
FIG. 2 is a cross section of the container shown in FIG. 1, taken along the line 2—2, but with the top of the container closed.
Figure 3:
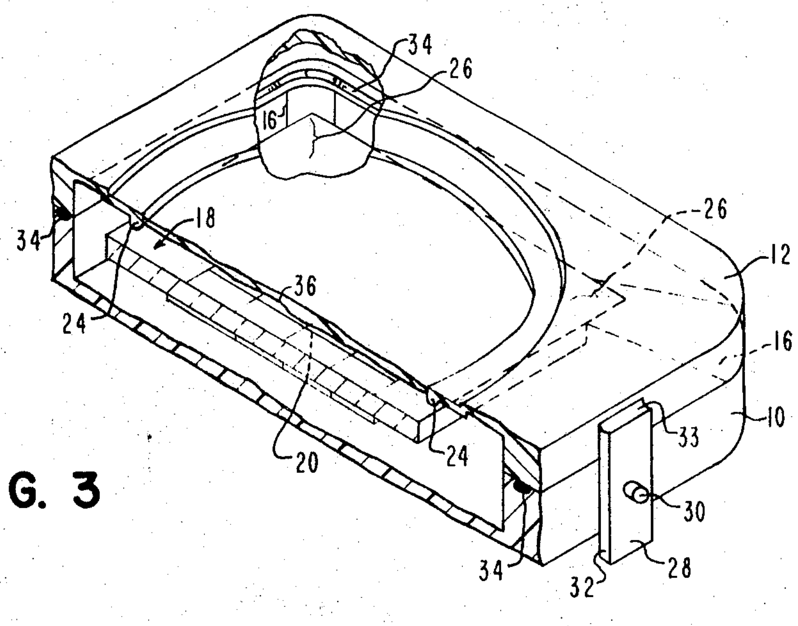
FIG. 3 is a perspective view of the container in FIG. 1 with the top closed, broken along the line 3—3 in FIG. 1 and with a partial cut away in the container top to show interior detail.

Referring now to the drawings, more particularly to FIGS. 1, 2, and 3, the features of an embodiment of the storage container are shown. The container is molded in one piece of polyethylene, polypropylene, or other resilient plastic material and has a bottom 10 and a top 12 joined by an integral hinge 14. The hinge 14 is desirably a "living" polymeric plastic material for durability in long term use of the container. Four supports 16 integral to the bottom 10 of the container are provided. Glass mask 18 rests on step 19 of supports 16.

Glass mask 18 contains an array 20 of the desired pattern of areas 22 (shown on the underside of the mask 18), which are used for exposing selectively areas in photoresist on the surface of a semiconductor wafer. It is the array 20 which must be protected against damage to maintain image integrity in the mask. For clarity, only a small number of areas 22 have been shown in the pattern. It should be recognized that actual patterns in masks to fabricate typical integrated circuits contain as many as several hundred areas 22.

Top 12 of the container has an annular ridge 24 on its inside surface which presses down on glass mask 18 around its periphery 26 when the glass mask is in position on steps 19 of supoprts 16, as best shown in FIGS. 2 and 3. With the top 12 of the container in the closed position, annular ridge 24 co-acts with support 16 to apply substantially directly opposing forces to the periphery 26 of glass mask 18. No contact with the portion of the mask 18 containing array 20 is necessary to support the mask in the container. To provide protection against breakage of the mask 18 should the container be dropped, annular ridge 24 and support 16 should impart substantially directly opposing forces to the mask 18. If the forces are not substantially directly opposing, a substantial bending force may be applied to the mask 18, thus causing breakage. As shown in FIGS. 1, 2, and 3, ridge 24 may press down on mask 18 a small distance from the ends of steps 19 and still not result in breakage or damage to mask 18 should the container be dropped. If the ridge 24 were located near the center of the mask, such breakage could occur.

Bottom 10 and top 12 of the container are held in the closed position by interlocking tabs 28 and projections 30 on the sides of the top and bottom. When the tabs and projections interlock, the ends 32 of tabs 28 extend below the bottom 10 of the container, as shown in FIG. 3. This provides a nesting capability for the containers when stacked on each other, further helping to prevent accidental breakage of the glass mask 18. Hinges 33, similar to hinge 14, join tabs 28 integrally to top 12.

A gasket 34 made of rubber or other material which will provide a fluid tight seal, is provided around the edge of bottom 10 of the container and is sealingly engaged by the top and bottom of the container when closed. Gasket 34 prevents the introduction of dust or other contaminants into the container during storage of a glass mask. Additionally, gasket 34 provides the capability of storing the glass mask in the container outside of a clean room in which it is used for exposing photoresist selectively. Dust which settles on the container outside the clean room may be removed by immersing the container in a quick drying solvent. The gasket 34 assures that the solvent will not enter the container and contact the mask. Previously used containers for glass masks were not fluid tight. It was therefore necessary to store as well as use the masks in clean rooms because dust could enter the containers. Also, the exterior of the prior art containers could not be cleaned by immersion in a solvent without solvent entering the containers.

Glass mask 18 is preferably stored in the container with the side containing array 20 in the desired pattern of areas 22 facing down. Should dust or other contaminants enter the container they will tend not to come to rest on array 20. Also, placing the glass mask in the container in this way helps assure that no part of the container will contact the array 20. The mask may also be placed face up in the container as long as care is taken to prevent the middle portion 36 of the top 12 from contacting the array 20.

Figure 4:
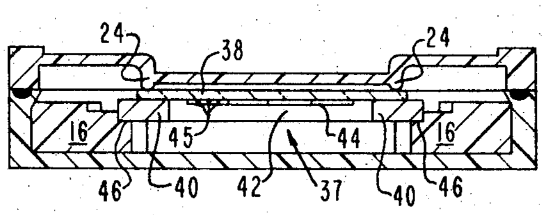
FIG. 4 is a cross section as in FIG. 2, but with a different type of glass mask in the container.

FIG. 4 shows a cross section of the container with a different type of glass mask 37 within it. The mask 37 consists of glass plate 38 mounted to a metallic backing member 40 containing a central opening 42 large enough to receive array 44 defining the desired pattern of areas 45 in the mask. This mask rests on the lower step 46 of support 16. Due to the greater thickness of this mask, support 16 and annular ridge 24 co-act to impart directly opposing forces to this type of mask when the container is closed. No bending stress is therefore applied to this mask by the support and ridge.

It should now be apparent that a container for breakable plates, such as glass masks, capable of obtaining the stated objects has been provided. The container will hold a glass mask securely in place without contacting the sensitive image area of the mask and protect the mask against damage from breakage or jostling. The container is fluid tight and prevents dust or other contaminants from entering to contaminate and damage the glass mask. While attaining these needed characteristics for glass masks, very easy insertion and removal of the mask is attained. The mask may be simply lifted from or lowered onto the supports 16 when the container is open. No additional parts need be handled nor need the mask be carefully maneuvered into place. A container capable of meeting the rigid requirements storing and handling glass masks and suitable for use in the high volume production of integrated circuits has been provided. Most significantly, these rigid requirements have been met in a container of essentially unitary construction that can be fabricated in a single, inexpensive molding operation.

A container having the features described above may be used for other breakable plate materials as well. For example, with only slight modification of the structural details, the container could be used for storing and handling a semiconductor wafer both during and after manufacture of integrated circuits in the wafer. The action of the support and the biasing member would hold such a wafer securely yet not require contacting the interior area of the wafer containing the integrated circuits. Similarly, a container embodying the invention could be used to hold and support a metallic plate containing an interior area subject to damage from contact, such as a copper plate containing an array of nickel-iron magnetic film memory elements deposited on the interior portion of its surface.

While the invention has been particularly shown and described with reference to the preferred embodiments thereof, it will be understood by those skilled in the art that various changes in form and detail may be made therein without departing from the spirit and scope of the invention.

What is claimed is:

1. A resilient plastic container for a plate having at least one surface liable to damage from contact having:

(A) a top member,
(B) a bottom member,
(C) a hinge joining the top and bottom members,
(D) means in the bottom member for supporting the plate at its periphery,
(E) means forming a part of said top member for biasing the plate against said means for supporting the plate at its periphery, said means for supporting the plate and said means for biasing the plate co-acting to apply substantially directly opposing forces to the plate at its periphery when the container is closed,
(F) a plurality of tabs on one of said members, and
(G) a plurality of projections on the other of said members which interlock with said tabs, said tabs projecting downward beyond said other member when said tabs and projections are in interlocking relationship.

2. The container of claim 1 additionally comprising:

(H) a gasket disposed in sealing relationship between the edges of said top and bottom of the container when the container is closed.

3. The container of claim 1 in which said container is of unitary construction.

4. A resilient plastic container for a plate having at least one surface liable to damage from contact having:

(A) a top,
(B) a bottom,
(C) a hinge joining the top and bottom,
(D) means in the bottom for supporting the plate at its periphery,
(E) integral means forming a part of said top for biasing the plate against said means for supporting the plate at its periphery, said means for supporting the plate and said means for biasing the plate co-acting to apply substantially directly opposing forces to the plate at its periphery when the container is closed,
(F) a plurality of tabs on said top of the container, and
(G) a plurality of projections on said container bottom which interlock with said tabs, said tabs projecting downward beyond said container bottom when said tabs and projections are in interlocking relationship.

References Cited

UNITED STATES PATENTS

| | | | |
|---|---|---|---|
| D. 218,922 | 10/1970 | De Vore et al. | 220—31 S |
| 3,416,701 | 12/1968 | Kramer et al. | 220—55 G |
| 3,489,265 | 1/1970 | Puente | 150—.5 |
| 2,864,491 | 12/1958 | Paterson | 206—62 |
| 2,967,009 | 1/1961 | Lidgard | 206—62 |
| 3,465,875 | 9/1969 | McKelvey, Jr. | 206—62 |

FOREIGN PATENTS

| | | | |
|---|---|---|---|
| 986,260 | 3/1965 | Great Britain | 220—55 G |

OTHER REFERENCES

IBM Technical Disclosure Bulletin, vol. 8, No. 11, April 1966, p. 1642, "Wafer Package" by L. Hershoff.

JOSEPH R. LECLAIR, Primary Examiner

S. MARCUS, Assistant Examiner

U.S. Cl. X.R.

150—.5; 206—DIG. 15; 220—55 G, 97 R